(12) United States Patent
Thurgate et al.

(10) Patent No.: US 8,208,296 B2
(45) Date of Patent: Jun. 26, 2012

(54) APPARATUS AND METHOD FOR EXTENDED NITRIDE LAYER IN A FLASH MEMORY

(75) Inventors: Timothy Thurgate, Sunnyvale, CA (US); Shenqing Fang, Fremont, CA (US); Kuo Tung Chang, Saratoga, CA (US); Youseok Suh, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 307 days.

(21) Appl. No.: 12/706,710

(22) Filed: Feb. 16, 2010

(65) Prior Publication Data

US 2011/0199819 A1 Aug. 18, 2011

(51) Int. Cl.
*G11C 11/34* (2006.01)
(52) U.S. Cl. ............................ 365/185.01; 365/185.24
(58) Field of Classification Search ............ 365/185.01, 365/185.24
See application file for complete search history.

(56) References Cited

U.S. PATENT DOCUMENTS

| | | | |
|---|---|---|---|
| 2004/0165429 A1* | 8/2004 | Saeki et al. | 365/185.01 |
| 2008/0019173 A1* | 1/2008 | Li | 365/185.02 |
| 2008/0043524 A1* | 2/2008 | Maejima et al. | 365/185.01 |

* cited by examiner

*Primary Examiner* — Michael Tran
(74) *Attorney, Agent, or Firm* — Frommer, Lawrence & Haug LLP; Matthew M. Gaffney

(57) ABSTRACT

A method and apparatus for storing information is provided. A core region of memory includes a semiconductor layer, at least one shallow trench, an insulator, and a charge-trapping layer. The semiconductor layer includes at least one source/drain region, and the insulator disposed above the source/drain region. The charge trapping layer is within the insulator, and the charge trapping layer is above the entire width of the source/drain region, and extends at least one angstrom beyond the width of the source/drain region, so that a portion the charge trapping layer extends into at least one shallow trench.

18 Claims, 7 Drawing Sheets

APPARATUS AND METHOD FOR EXTENDED NITRIDE LAYER IN A FLASH MEMORY

TECHNICAL FIELD

The invention is related to computer-readable memory, and in particular, but not exclusively, to a method and method for a flash memory having a charge storage layer that extends beyond the source/drain region.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

Some flash memory cells uses shallow trench isolation (STI) to prevent electrical current leakage between adjacent memory cells in the flash memory. One type of STI that may be used in flash memory is self-aligned STI. However, there is a limitation in the state of the art as to how narrow flash memory device with an STI structure can be and still program properly. For example, a NAND flash memory with self-aligned STI with an ONO layer having a channel width (W) less than about 50 nm does not program properly due to edge fringing field effects, and so such devices do not appear to be functional in the current state of the art. There do not appear to be any solutions to this problem in the prior art.

BRIEF DESCRIPTION OF THE DRAWINGS

Non-limiting and non-exhaustive embodiments of the present invention are described with reference to the following drawings, in which.

DETAILED DESCRIPTION

Figure 1:
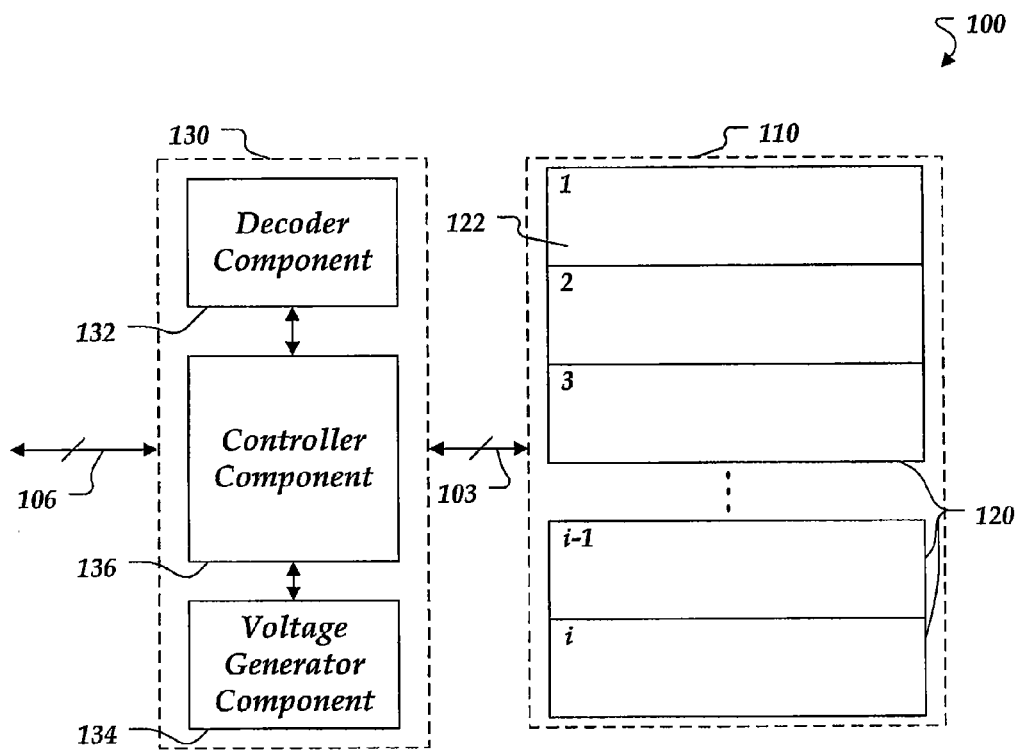
FIG. 1 illustrates a block diagram of an embodiment of a memory.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a method and apparatus for storing information. A core region of memory includes a semiconductor layer, at least one shallow trench, an insulator, and a charge-trapping layer. The semiconductor layer includes at least one source/drain region, and the insulator disposed above the source/drain region. The charge trapping layer is within the insulator, and the charge trapping layer is above the entire width of the source/drain region, and extends at least one angstrom beyond the width of the source/drain region, so that a portion the charge trapping layer extends into at least one shallow trench.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although described in the context of a flash-based memory, the fabrication described herein may be employed in manufacturing other types of microelectronic memories or devices other than memory in which a SONOS-like trap layer is employed.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-$i$) that can be accessed via memory controller 130. Memory sectors 120 can include, for example, 256, 512, 1024, 2048 or more sectors having memory cells that can be individually or collectively accessed. For example, in a NAND-based architecture, the individual memory cells are accessed collectively. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110. In an NAND-based architecture, individual memory cells can be accessed collectively but not individually.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In one embodiment, memory 100 is a flash-based memory including flash-based memory cells, such as flash-based NAND cells, NOR cells, or hybrids of the two.

Figure 2:
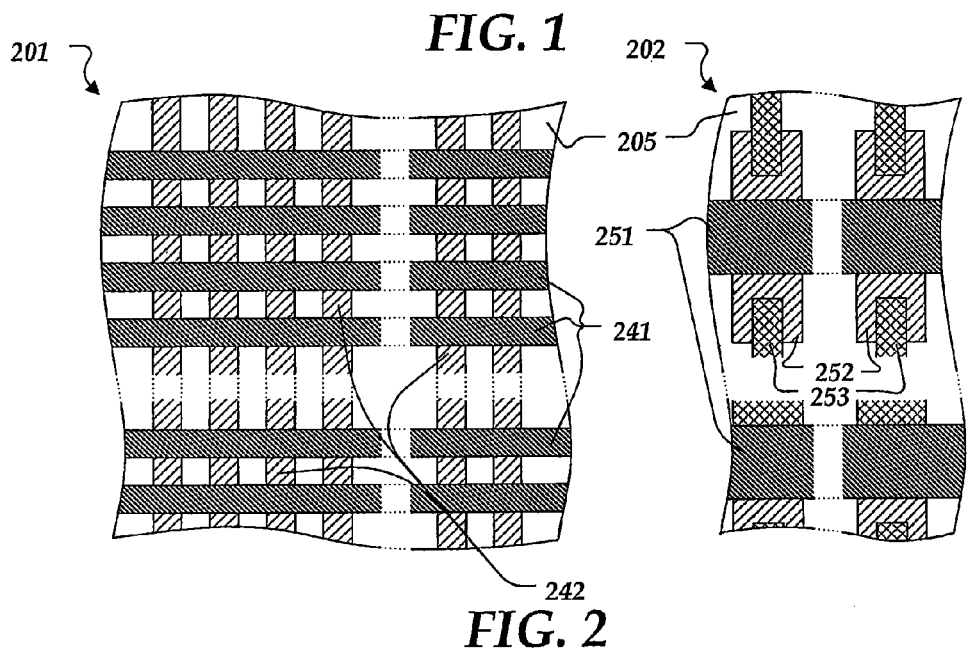
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown if FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
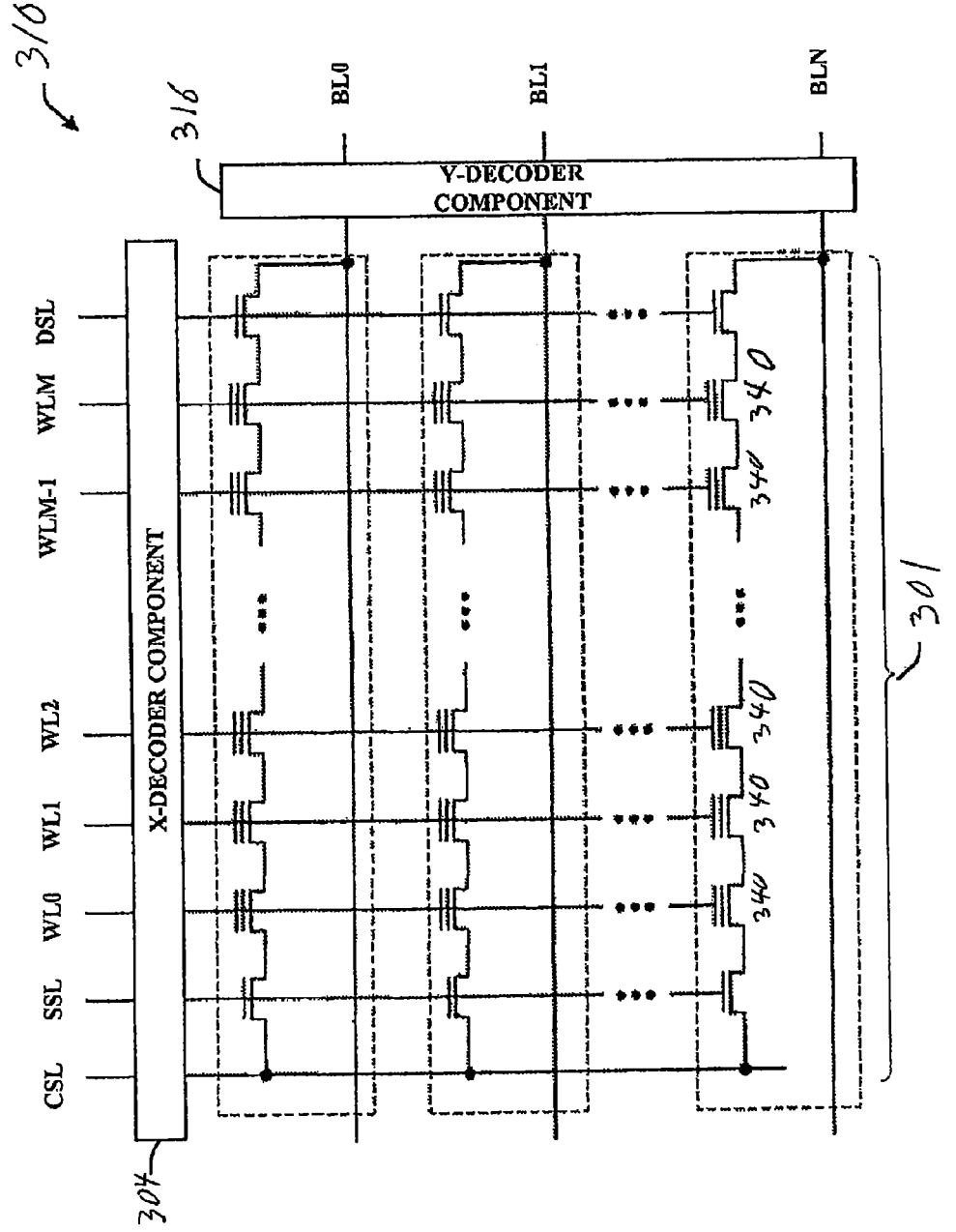
FIG. 3 illustrates a block diagram of an embodiment of a NAND memory array.

FIG. 3 illustrates a block diagram of an embodiment of a NAND memory array (310) that may be employed as an embodiment of memory array 110 of FIG. 1. Memory array 310 includes memory cells 340. Each memory cell 340 stores one or more bits of data. Memory array 310 can be associated with an X-decoder component 304 (e.g., word line (WL) decoder) and a Y-decoder component 316 (e.g., bit line (BL) decoder) that can each respectively decode inputs/outputs during various operations (e.g., programming, reading, verifying, erasing) that can be performed on the memory cells 340. The X-decoder component 304 and Y-decoder component 316 can each receive address bus information from memory controller 130 of FIG. 1, and can utilize such information to facilitate accessing or selecting the desired memory cell(s) (e.g., memory location(s)) associated with the command. The memory cells 340 can be formed in M rows and N columns. A common WL can be attached to the gate of each memory cell 340 in a row, such as word-lines WL0, WL1, WL2, through WLM. A common BL is attached collectively to cells 340, such as bit-lines BL0, BL1, through BLN as depicted in the respective diagrams. Respective voltages can be applied to one or more cells 340 through the WLs and BLs to facilitate performing operations, such as program, read, erase, and the like.

Figure 4:
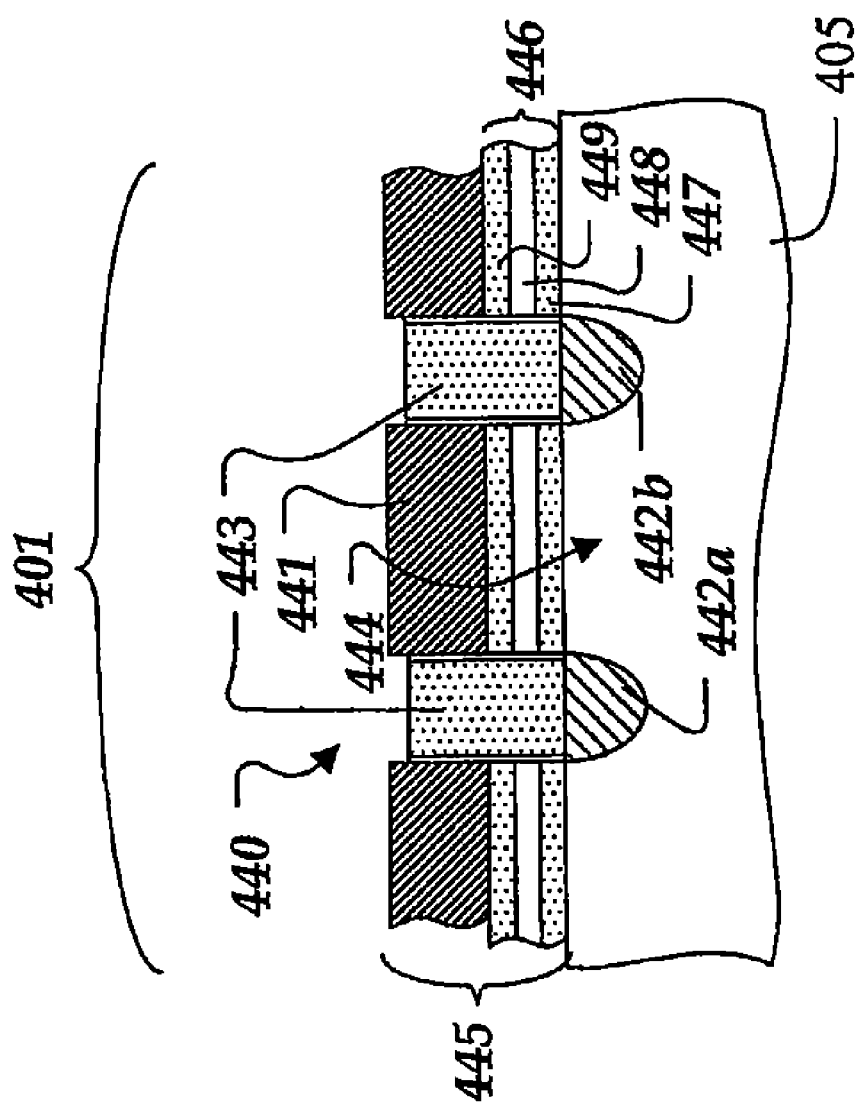
FIG. 4 shows a cross-sectional side view of an embodiment of a core section of FIG. 2.

FIG. 4 shows a cross-sectional side view of a memory cell in core section 401. In one embodiment, core section 401 is an embodiment of core section 201 of FIG. 2.

Memory cell 440 includes a portion of substrate 405, dielectric spacer layer 443, channel region 444, source/drain regions 442*a* and 442*b*, and layered stack 445, including charge trapping component 446 and a portion of core polysilicon line 441. Substrate 405 may be an embodiment of substrate 205 of FIG. 2. Source/drain regions 442*a* and 442*b* may be an embodiment of one or more conductive regions 242 of FIG. 2. Core polysilicon line 441 may be an embodiment of an individual core polysilicon line 241 of FIG. 2.

In operation, core polysilicon line 441 and source/drain regions 442*a* and 442*b* are configured to provide electrical potential(s) to memory cell 440 for trapping charge at charge trapping component 446. A bit is "programmed" when it is trapping a charge and "unprogrammed" when it is not trapping charge. To trap charge, charge trapping component 446 employs tunneling layer 447, charge trapping layer 448, and dielectric layer 449. In general, tunneling layer 447 provides a tunneling barrier, charge trapping layer 448 is a layer that is configured to store charge, and dielectric layer 449 electrically isolates charge trapping layer 448 from core polysilicon line 441. In one embodiment, memory cell 440 is a one bit memory cell that is configured to store up to two logic states. In another embodiment, memory cell 440 can store more than two logic (or bit) states.

In some embodiments, charge trapping component 446 is an oxide-nitride-oxide (ONO) layer in which dielectric layer 449 is an oxide (such as silicon dioxide), charge trapping layer 448 is a nitride, and tunneling layer 447 is an oxide (such as silicon dioxide). In one embodiment in which charge trapping layer 448 is a nitride, charge trapping layer 448 may be a silicon-rich nitride (SIRN) such as silicon nitride.

Figure 5:
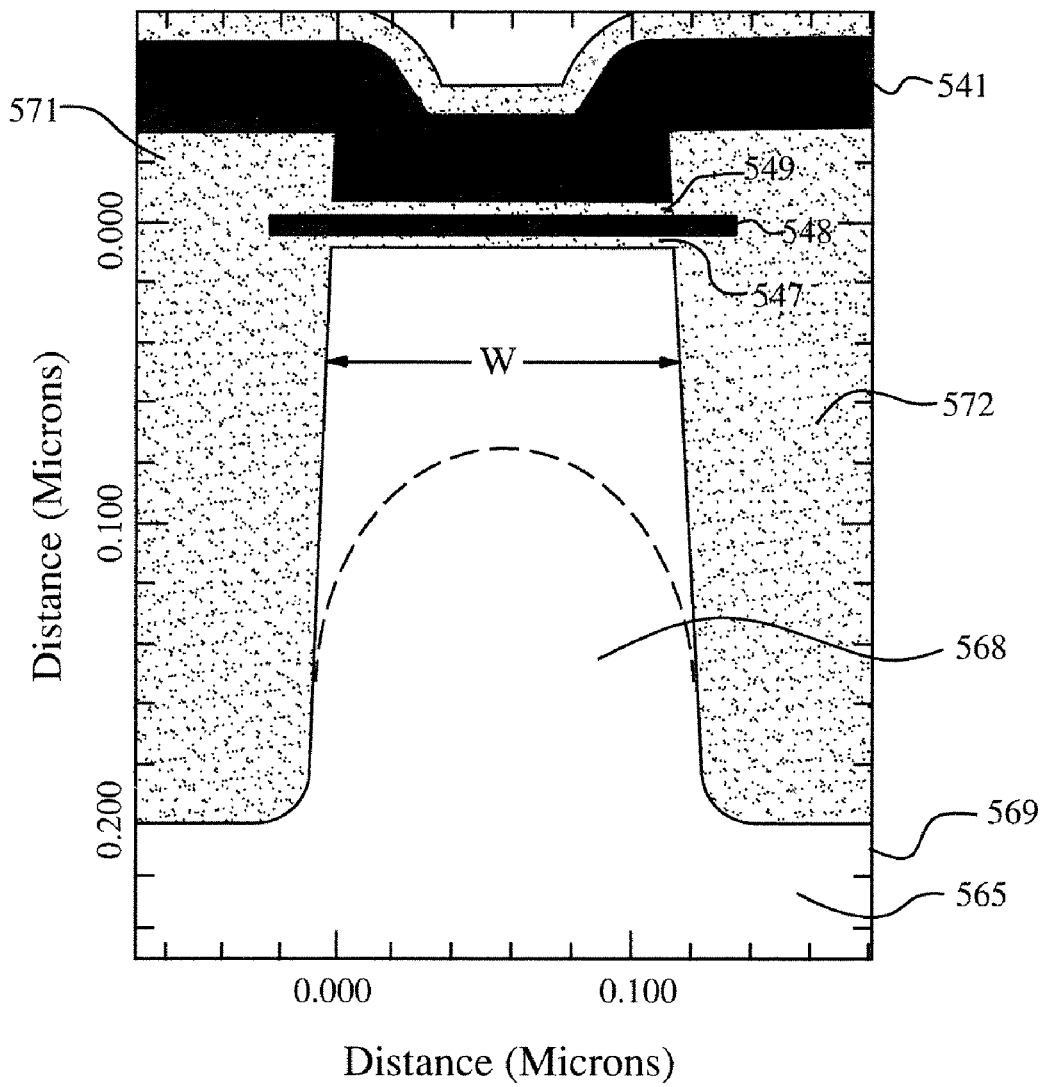
FIG. 5 illustrates a cross-sectional view of an embodiment of a portion of the memory cell of FIG. 4 with an extended charge storage layer.

FIG. 5 illustrates a cross-sectional view of an embodiment of a memory cell 540. The cross-sectional view illustrated in FIG. 5 is orthogonal to the view illustrated in FIG. 4. Memory cell includes shallow trench 571, shallow trench 572, silicon layer 569, tunneling layer 547, charge trapping layer 548, dielectric layer 549, and polysilicon layer 541. Silicon layer 569 includes substrate 565 and source/drain region 568.

Memory cell 540 uses shallow trench isolation (STI) to prevent electrical current leakage between adjacent memory cells in the flash memory. In some embodiments, self-aligned shallow trench isolation is employed. Each shallow trench 571 and 572 may include an insulator such as silicon dioxide. In some embodiments, shallow trench 571, shallow trench 572, tunneling layer 547, and dielectric layer 549 are all silicon dioxide. Source/drain region 568 includes source/ drain regions such as source drains 442*a* and 442*b* of FIG. 4. The actual cross-section shown would actually include a cross-section of the channel region 444 of FIG. 4 of the substrate between the source-drain regions, where once source/drain region would be above the page, and one source/region would be below the page, with the channel being between the two source/drain regions, but this region is conventionally referred to as the source/drain region in such a cross-section drawing even though it is literally cross-section of the channel region that is in the specific cross-section shown. The source/drain region (which, again, is also the channel) has a width, W, as shown in FIG. 5.

Charge trapping layer 548 is above source/drain region 568, and is above the entire width W of source/drain region 547, and further extends at least one angstrom beyond the width of source/drain region 548, on the left and/or the right, so that charge trapping layer 548 extends into one or both of shallow trench 571 and shallow trench 572. In some embodiments, charge trapping layer 548 is symmetrical such that it extends beyond the left side of the source drain region and the right side of the source/drain region a substantially equal amount. In some embodiments, charge trapping layer 548 is a nitride such as silicon nitride.

The device shown in FIG. 5 has a channel width W of about 45 nm. At that width, using a nitride as the charge trapping layer 548, and using self-aligned STI, if charge trapping layer 548 did not extend beyond channel width W, the device would not program properly. The nitride would not turn off the corner of the channel region at the shallow trench. Fringing electric fields would go around the nitride and converge on the corner, turning it on, even with negative charge on the nitride. As illustrated in FIG. 5, the vertical electric field is strongest at the corner (of the channel region). As a result of this edge fringing field effect, a relatively narrow device is dominated by the corner, and the threshold voltage $V_T$ is substantially the same in both the programmed and unprogrammed states. The IV curve of the unprogrammed state would be virtually indistinguishable from the IV curve of the programmed state. The IV curves referred to herein at the drain current versus gate voltage curves (for both the programmed and unprogrammed state). Extending the nitride past the edge of the source/drain region 568 allows the corner to be turned off and the device to program. The charge trapping layer 548 may be extended in a number of different manners in different embodiments. The ability to program the device may be further improved by extending the nitride farther, since this further separates the IV curves of the programmed state and the unprogrammed state from each other. Extending the nitride by about 150 to 200 Angstroms effectively shuts off the corner.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 6:
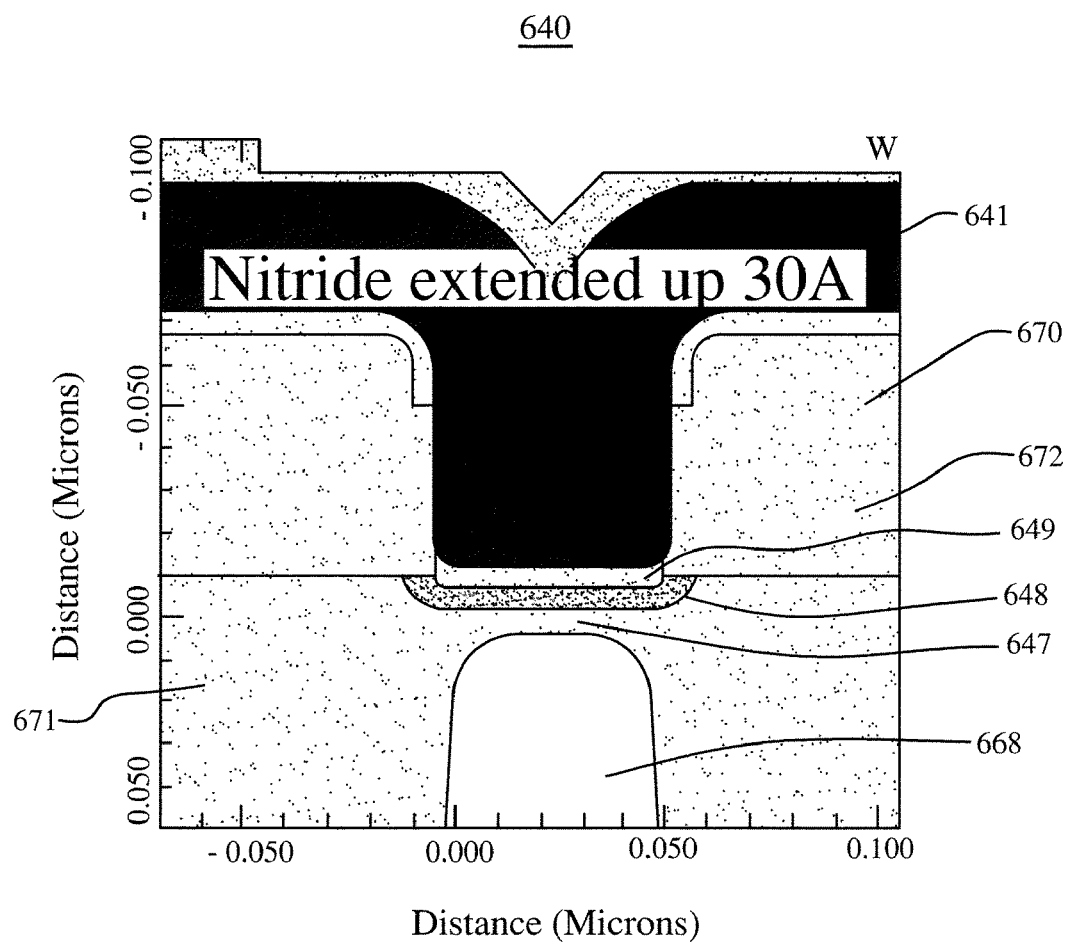
FIG. 6 shows a cross-sectional view of embodiment of the memory cell of FIG. 5 with the nitride layer extended up 30 Angstroms.

FIG. 6 shows a cross-sectional view of embodiment of memory cell 640, which may be employed as an embodiment of memory cell 540 FIG. 5 with the nitride layer extended up 30 Angstroms. Memory cell 640 includes source/drain region 668, oxide layer 670, nitride layer 648, and polysilicon layer 641. Oxide layer 670 includes shallow trench 671, shallow trench 672, oxide layer 647, and oxide layer 649.

As shown, nitride layer is extended beyond channel width W into shallow trench 671 and shallow trench 672, and is also curved upwards such that the upper part of nitride layer 648 extends thirty angstroms above the lower part of nitride layer 648. Extending nitride layer 648 up causes further separation in the IV curves between the programmed and unprogrammed states.

In FIG. 6, the source/drain region 668 is rounded. That is, the corners of source/drain region 668 are rounded. Rounding source/drain region improves the ability to program, but at the expense of core current. In some embodiments, the source/drain region 668 is rounded as shown in FIG. 6, and in other embodiments, source/drain region 668 is rounded less than illustrated in FIG. 6 or is not rounded at all.

In FIG. 6, the corners of the bottom edge of polysilicon layer 641 are rounded slightly. Rounding the polysilicon corners is more effective for enabling corners than rounding the corners of the source/drain region, and does not degrade the core current more than rounding the source/drain region corners. However, it still causes core current degradation. In various embodiments, the corner rounded may be more or less than shown in FIG. 6, or no rounding is performed at all in some embodiments.

Figure 7:
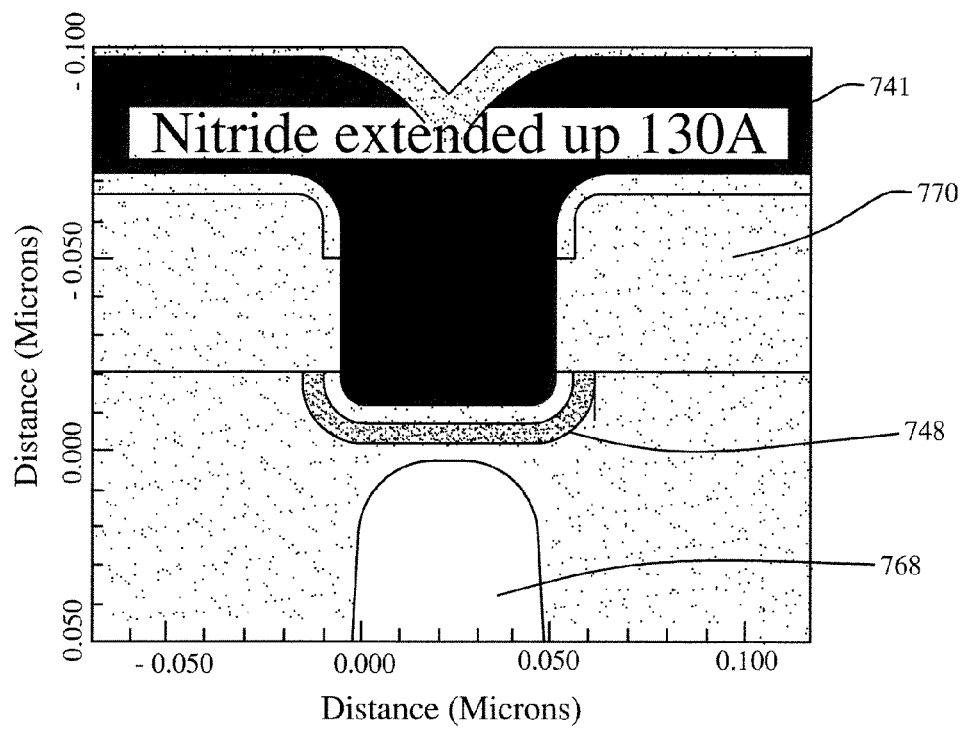
FIG. 7 illustrates a cross-sectional view of embodiment of the memory cell of FIG. 5 with the nitride layer extended up 130 Angstroms.

FIG. 7 shows a cross-sectional view of an embodiment of memory cell 740, which may be employed as an embodiment of memory cell 640 FIG. 5 with the nitride layer extended up 130 Angstroms rather than 30 Angstroms. By extended nitride layer 748 up further, the result is further separation in the IV curves between the programmed and unprogrammed states. In this example, the nitride 748 is wrapped around the polysilicon layer bottom corners.

Figure 8:
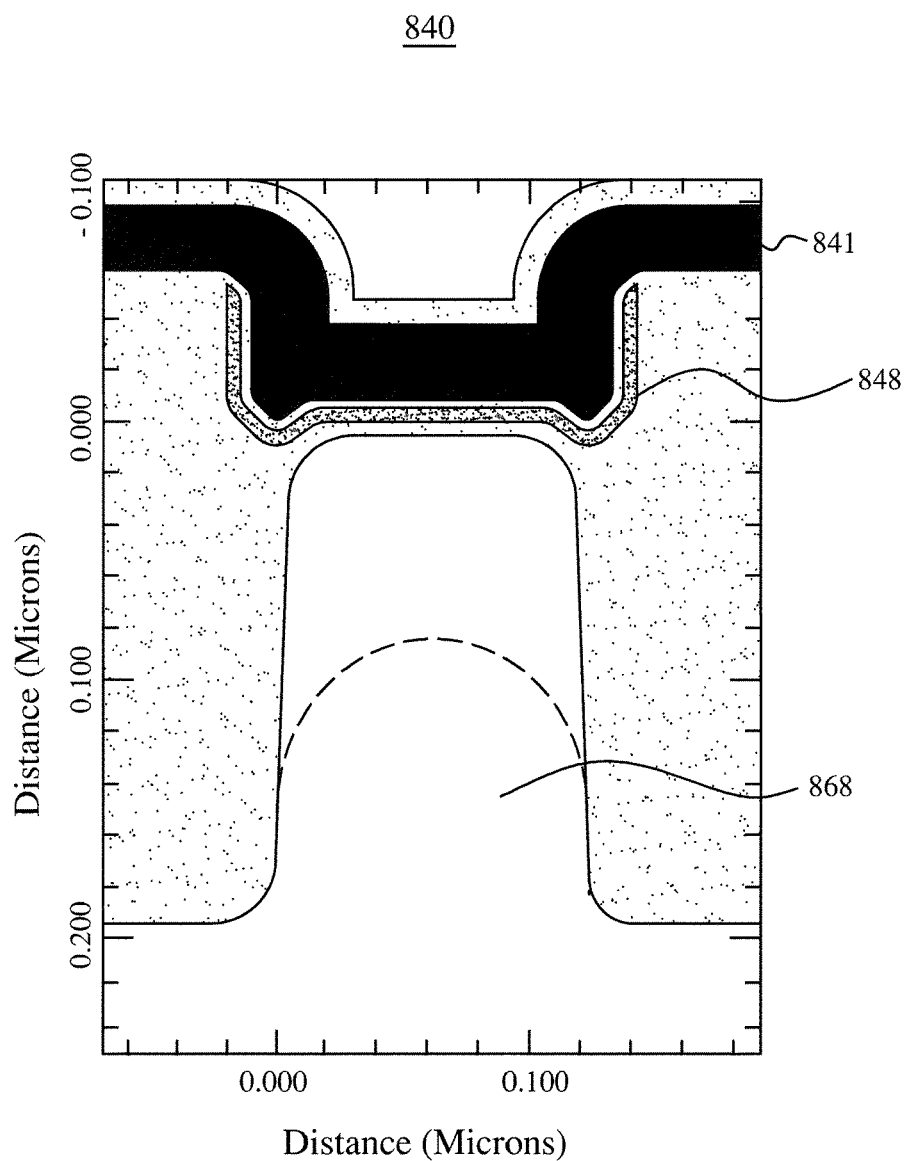
FIG. 8 shows a cross-sectional view of embodiment of memory cell of FIG. 5 with the nitride layer wrapped around the polysilicon, arranged in accordance with aspects of the invention.

FIG. 8 shows a cross-sectional view of embodiment of the flash memory 840, which may be employed as an embodiment of flash memory 740 of FIG. 7 in which the nitride layer 848 is wrapped around the polysilicon 841. Wrapping the nitride 848 around the polysilicon 841 further improves the programming. By wrapping the nitride 848 around the polysilicon 841, the nitride does not have to be extended very far past the source/drain region to shut down the corner. As previously discussed, in various embodiments, the amount of corner rounding may be more or less than the corner rounding illustrated in FIG. 8, and in some embodiments, corner rounding is not performed at all.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A device for storing information, comprising:
a core region of memory, including:
   a semiconductor layer, including a first source/drain region;
   a first shallow trench;
   an insulator disposed above the first source/drain region; and
   a charge trapping layer disposed within the insulator, wherein the charge trapping layer is above the entire width of the first source/drain region, and extends at least one angstrom beyond the width of the first source/drain region, such a portion the charge trapping layer extends into the first shallow trench.

2. The device of claim 1, wherein
the insulator extends at least thirty angstroms beyond the width of the source/drain region.

3. The device of claim 1, wherein
the charge trapping layer is curved upwards such that an upper part of the charge trapping layer extends at least thirty angstroms above a lower part of the charge trapping layer.

4. The device of claim 1, wherein
a top of the source/drain region is curved.

5. The device of claim 1, wherein
the core region of memory employs self-aligned shallow trench isolation.

6. The device of claim 1, wherein
the charge trapping layer includes means for charge trapping, or wherein the insulator includes means for electrical isolation.

7. A machine-readable storage medium that includes an electronic design file that is arranged to control a fabrication of the device of claim 1.

8. A method, comprising transmitting, over a network, an article of manufacture including a machine-readable medium that includes an electronic design file that is arranged to control a fabrication of the device of claim 1.

9. The device of claim 1, wherein
the charge trapping layer is a nitride.

10. The device of claim 9, wherein
the nitride is silicon rich nitride.

11. The device of claim 1, wherein
the insulator is an oxide.

12. The device of claim 11, wherein
the oxide is silicon dioxide.

13. The device of claim 1, wherein
the core region of memory further includes a polysilicon layer that is disposed above the insulator.

14. The device of claim 13, wherein
the charge storage layer is wrapped around at least a portion of the polysilicon layer.

15. The device of claim 13, wherein
the polysilicon layer has bottom corners near the charge trapping layer, wherein the bottom corners of the polysilicon line are rounded.

16. A device for storing information, comprising:
a core region of memory, including:
   a semiconductor layer, including a first source/drain region;
   a first shallow trench that is adjacent to the first source/drain region;

a second shallow trench that is adjacent to the first source/drain region;

an oxide-nitride-oxide (ONO) layer disposed above the first source/drain region, wherein the ONO layer includes a nitride layer that is above the entire width of the first source/drain region, and extends at least one angstrom beyond the width of the first source/drain region, such that a portion of the nitride layer extends into the first shallow trench.

17. The device of claim 16, wherein
the core region of memory employs self-aligned shallow trench isolation.

18. A method for storing information, comprising:
causing a memory device to perform a data access, wherein the memory device includes:
a core region of memory, including:
a semiconductor layer, including a first source/drain region;
a first shallow trench;
an insulator disposed above the first source/drain region; and
a charge trapping layer disposed within the insulator, wherein the charge trapping layer is above the entire width of the first source/drain region, and extends at least one angstrom beyond the width of the first source/drain region, such a portion the charge trapping layer extends into first shallow trench.

* * * * *